(12) United States Patent
Kim et al.

(10) Patent No.: US 10,701,843 B1
(45) Date of Patent: Jun. 30, 2020

(54) DISPLAY APPARATUS

(71) Applicant: SAMSUNG ELECTRONICS CO., LTD., Suwon-si, Gyeonggi-do (KR)

(72) Inventors: Sung Ki Kim, Suwon-si (KR); Hyun Jun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/415,646

(22) Filed: May 17, 2019

(30) Foreign Application Priority Data

Jan. 25, 2019 (KR) .......................... 10-2019-0009925

(51) Int. Cl.
*H05K 7/20* (2006.01)
(52) U.S. Cl.
CPC ..... *H05K 7/20972* (2013.01); *H05K 7/20145* (2013.01)
(58) Field of Classification Search
None
See application file for complete search history.

(56) References Cited

U.S. PATENT DOCUMENTS

| 7,633,751 | B2* | 12/2009 | Shinotou | ............ | H05K 7/20972 |
| | | | | | 349/58 |
| 7,983,045 | B2* | 7/2011 | Bhattacharya | ............ | G06F 1/20 |
| | | | | | 361/690 |
| 8,248,784 | B2* | 8/2012 | Nakamichi | ........ | H05K 7/20972 |
| | | | | | 361/679.46 |
| 8,797,737 | B2* | 8/2014 | Kang | ...................... | G07F 9/105 |
| | | | | | 361/679.48 |
| 9,414,516 | B2* | 8/2016 | Chin | .................. | H05K 7/20145 |
| 2005/0105012 | A1* | 5/2005 | Kim | .................. | G02F 1/133308 |
| | | | | | 349/58 |
| 2009/0086430 | A1 | 4/2009 | Kang et al. | | |
| 2015/0124403 | A1* | 5/2015 | Lee | ......................... | G03B 21/16 |
| | | | | | 361/692 |
| 2018/0199450 | A1* | 7/2018 | Kim | .................. | G02F 1/133308 |
| 2019/0123094 | A1* | 4/2019 | Foster | ................ | H05B 33/0842 |

FOREIGN PATENT DOCUMENTS

| KR | 10-2004-0110414 | 12/2004 |
| KR | 10-2004-0110708 | 12/2004 |
| KR | 10-2005-0023514 | 3/2005 |
| KR | 10-2006-0101940 | 9/2006 |

OTHER PUBLICATIONS

International Search Report dated Nov. 20, 2019 in International Patent Application No. PCT/KR2019/009099.

* cited by examiner

*Primary Examiner* — Courtney L Smith
(74) *Attorney, Agent, or Firm* — Staas & Halsey LLP

(57) ABSTRACT

Provided is a display apparatus capable of enhancing the cooling efficiency. The display apparatus includes a display on which an image is to be displayed and a cooling device configured to discharge air from a rear side of the display by a fan. The cooling device includes a first fluid passage forming a first fluid flow at the rear side of the display and a second fluid passage forming a second fluid flow introduced from a periphery of the first fluid passage at the rear side of the display, to increase a flux of air discharged toward the display by the fan.

14 Claims, 9 Drawing Sheets

DISPLAY APPARATUS

CROSS-REFERENCE TO RELATED APPLICATION

This application is based on and claims priority under 35 U.S.C. § 119 to Korean Patent Application No. 10-2019-0009925, filed on Jan. 29, 2019 in the Korean Intellectual Property Office, the disclosure of which is incorporated herein by reference.

BACKGROUND

1. Field

The disclosure relates to a display apparatus, and more specifically, to a display apparatus for improving the cooling efficiency of a large-area display.

2. Description of the Related Art

In general, a display apparatus refers to an apparatus that displays an image on a screen, for example, a television, a computer monitor, a digital information display, and the like. The display apparatus may be divided into various types of display apparatuses according to a method of displaying image information, which is subjected to signal processing, on a screen. Recently, a method employing a liquid crystal display (LCD) and a method employing a plasma display panel (PDP) are widely used.

However, because a liquid crystal display panel of a LCD is a light receiving device that does not emit light by itself, the LCD includes a backlight assembly for providing a light source. The backlight assembly includes a light source for generating light, optical members provided to improve the optical efficiency, and a bottom chassis for accommodating the light source and the optical members.

Meanwhile, high-temperature heat generated in the light source increases the internal temperature of the backlight assembly, which leads to acceleration of the degradation.

In the recent years, the display apparatuses are in the trend of becoming larger in size and being installed outdoors or in the open air for advertisement. Examples of such a display apparatus includes a billboard that is arranged outside a building and displays an image.

When cooling such a 'The Wall' display or large-screen display apparatus using a cooling fan, a large number of fans are required to cool the large area, which leads to risk of malfunction or noise.

SUMMARY

Therefore, it is an object of the disclosure to provide a display apparatus capable of enhancing the cooling efficiency of a display especially a large-area display.

It is another object of the disclosure to provide a display apparatus capable of lowering the temperature of a large-area display through fan cooling with enhanced cooling efficiency.

It is another object of the disclosure to provide a display apparatus capable of reducing unpleasant feeling of a user due to a heat sensation by cooling the display apparatus through convection or conduction.

Additional aspects of the disclosure will be set forth in part in the description which follows and, in part, will be obvious from the description, or may be learned by practice of the disclosure.

Therefore, it is an aspect of the disclosure to provide a display apparatus including: a display on which an image is to be displayed; and a cooling device configured to discharge air from a rear side of the display using a fan, the cooling device including a flux augmentation guide including a first fluid passage forming a first fluid flow at the rear side of the display and a second fluid passage forming a second fluid flow introduced from a periphery of the first fluid passage at the rear side of the display, wherein the flux augmentation guide is configured to increase a flux of air discharged toward the display through the fan.

The cooling device may include: a case having an inlet and an outlet; and the fan provided in the case.

The flux augmentation guide may be provided at the outlet of the case.

The flux augmentation guide may include a plurality of vanes.

The flux augmentation guide may include at least one duct.

The flux augmentation guide may include a nozzle.

The rear side of the display apparatus may be disposed to be spaced apart from a wall on which the display is mountable, wherein the cooling device is disposed between the display and the wall.

The fan may be obliquely disposed with respect to a rear surface of the display.

The fan may include at least one of a screen fan or a circulator.

Air discharged through the flux augmentation guide may be directed parallel or at a first angle with respect to the rear surface of the display.

It is another aspect of the disclosure to provide a display apparatus including: a display including a plurality of display panels on which an image is to be displayed; and a cooling device configured to discharge air from a rear side of the display using a fan, wherein the cooling device includes a flux augmentation guide including a first fluid passage forming a first fluid flow and a second fluid passage forming a second fluid flow introduced from a periphery of the first fluid path to increase a flux of air discharged toward the display by the fan, wherein the air discharged through the flux augmentation guide is directed parallel or at a first angle with respect to the rear surface of the display.

The cooling device may include: a case having an inlet and an outlet; and the fan provided in the case.

The flux augmentation guide may be provided at the outlet.

The flux augmentation guide may include a plurality of vanes.

The flux augmentation guide may include a duct.

The flux augmentation guide may include a nozzle.

A rear surface of the display apparatus may be disposed to be spaced apart from a wall on which the display is mountable, wherein the cooling device may be disposed between the display and the wall.

The cooling device may be obliquely disposed with respect to a rear surface of the display.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
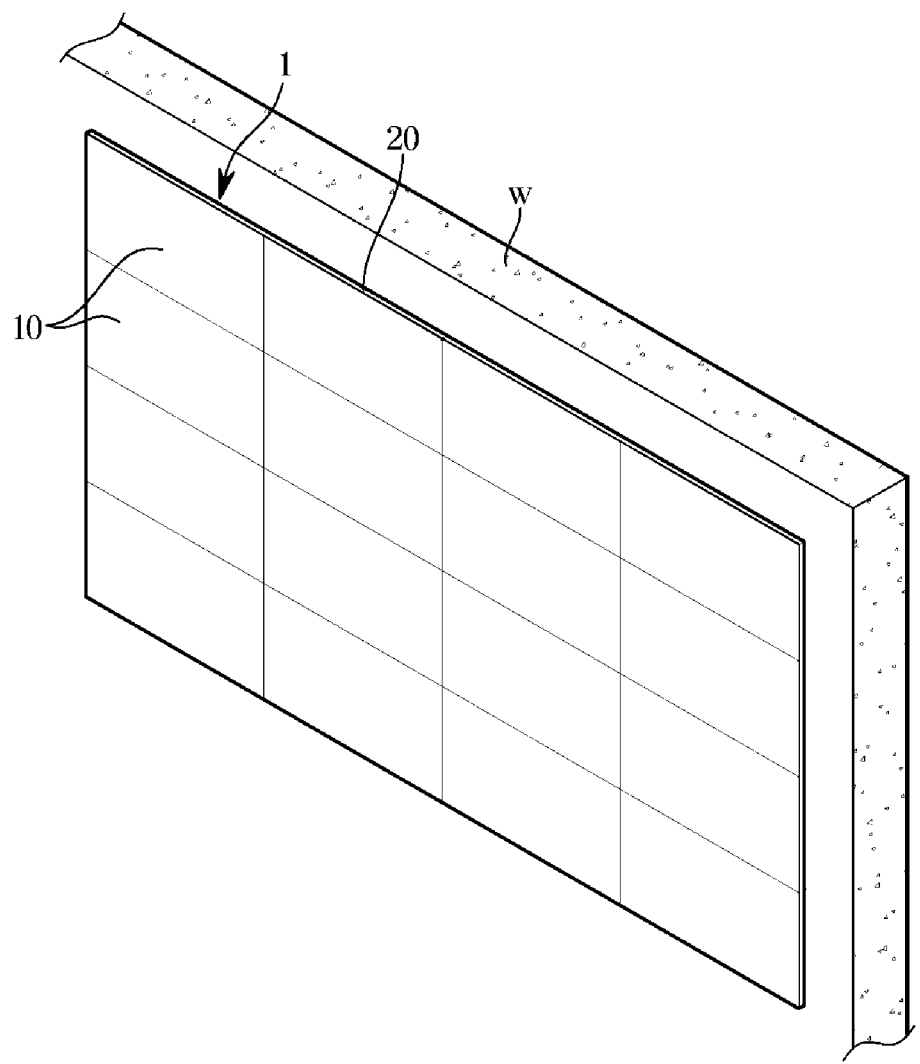
FIG. 1 is a perspective view schematically illustrating a display apparatus according to an embodiment of the disclosure.

Embodiments and features as described and illustrated in the disclosure are only preferred examples, and various modifications thereof may also fall within the scope of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the disclosure. Descriptions shall be understood as to include any and all combinations of one or more of the associated listed items when the items are described by using the conjunctive term "~and/or~," or the like.

Hereinafter, embodiments according to the disclosure will be described in detail with reference to the accompanying drawings.

Figure 2:
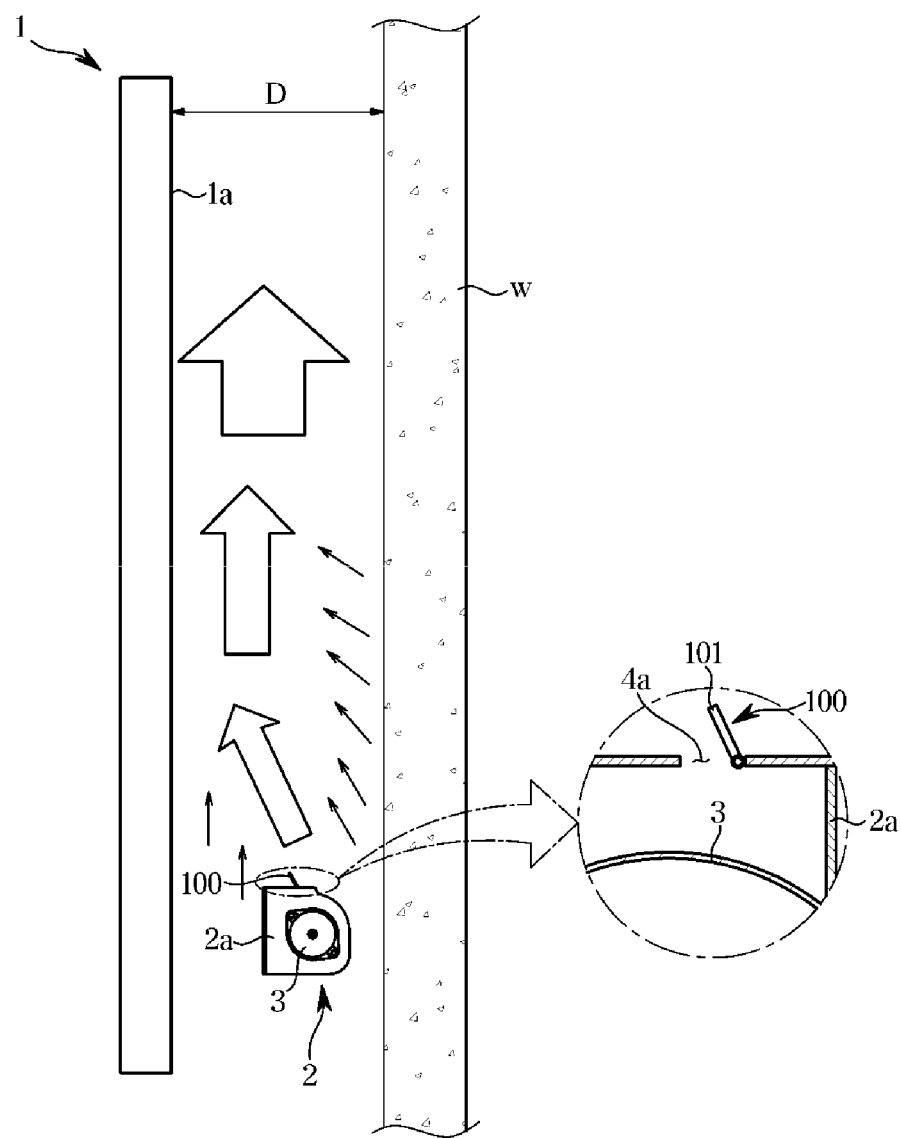
FIG. 2 is a view illustrating a display apparatus equipped with a cooling device according to an embodiment of the disclosure.
Figure 3:
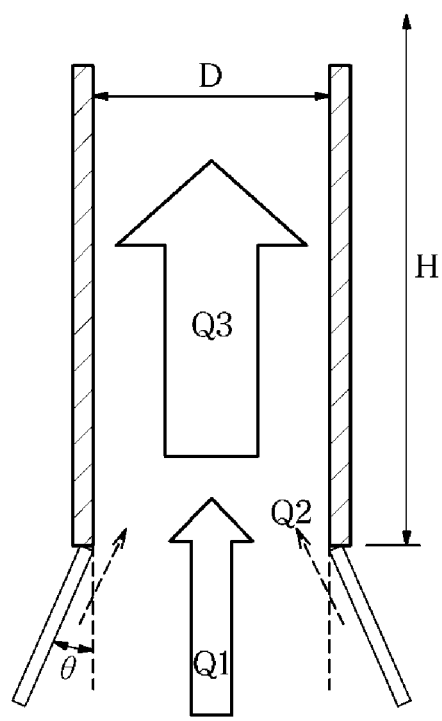
FIG. 3 is a view schematically illustrating an air flow by a flux augmentation guide according to an embodiment of the disclosure.
Figure 4:
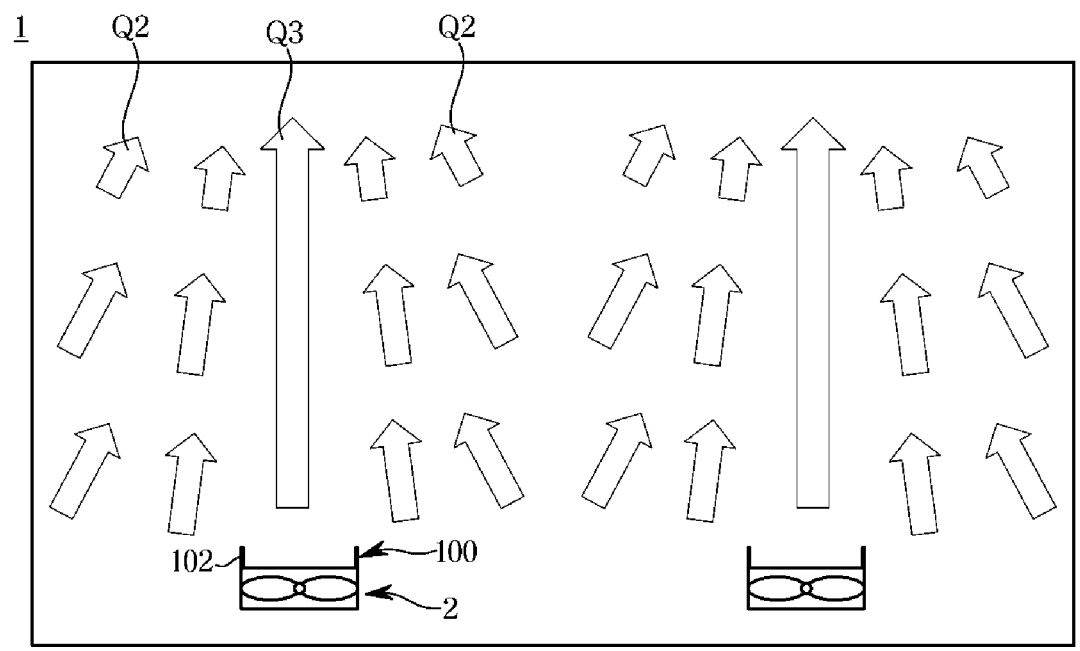
FIG. 4 is a view schematically illustrating an air flow by a cooling device according to an embodiment of the disclosure.

FIG. 1 is a perspective view schematically illustrating a display apparatus according to an embodiment of the disclosure, FIG. 2 is a view illustrating a display apparatus equipped with a cooling device according to an embodiment of the disclosure, FIG. 3 is a view schematically illustrating an air flow by a flux augmentation guide according to an embodiment of the disclosure, and FIG. 4 is a view schematically illustrating an air flow by a cooling device according to an embodiment of the disclosure.

Referring to FIGS. 1 to 4, a display apparatus 1 according to an embodiment of the disclosure is an apparatus that displays information, data, and the like in the form of text, a geometrical figure, a graph, an image, and the like, and includes a television (TV), a personal computer (PC), a mobile terminal, a digital signage, and the like. The display apparatus 1 may be installed on the floor (the ground) by a stand (not shown) or on a wall W.

The display apparatus 1 (hereinafter, referred to as a display 1) may include a chassis 20 and a plurality of display panels 10 installed on a front surface of the chassis 20 to display an image.

The chassis 20 may support the plurality of display panels 10.

The plurality of display panels 10 may be arranged in the form of an M×N matrix in a front and rear side direction and a left and right side direction. In the drawing, a total of sixteen units of the display panels 10 are illustrated in the form of a matrix such as a 4×4 matrix while being coupled to the chassis 20, but the number and arrangement of the display panels 10 may be variously set without limitation.

The display 1 may be mounted on the wall W by at least one mounting bracket (not shown) provided on the chassis 20. The at least one mounting bracket (a mounting device) may be coupled to the display 1 to be individually detachable.

The display 1 may be disposed at a predetermined distance D from the wall W. The display 1 may be installed at the predetermined distance D from the wall W by a mounting bracket.

Each display panel 10 of the display 1 may include a substrate (not shown) and a plurality of light emitting devices mounted on the substrate. The plurality of light emitting devices may generate high temperature heat from light emission.

Due to the heat emission, cooling of the display 1 may be required. The display 1 may be provided with a cooling device 2 to lower the temperature caused by each display panel 10.

The cooling device 2 may be disposed between the display 1 and the wall W. The cooling device 2 may be installed between the display 1 and the wall W. Although the cooling device 2 of the display 1 according to the embodiment of the disclosure is illustrated as being arranged and installed at a rear side of the display 1, the arrangement of the cooling device 1 according to the disclosure is not limited thereto. For example, the cooling device 2 may be fixed and installed on the mounting bracket of the display.

The cooling device 2 is provided to discharge air to a rear surface 1a of the display 1. The cooling device 2 is provided to discharge air toward the rear surface 1a of the display 1 from the rear side of the display 1. The cooling device 2 is provided to discharge air toward the display 1 from the rear side of the display 1. The cooling device 2 is provided to increase the flux of air discharged toward the rear surface 1a of the display 1. The air discharged through the cooling device 2 may allow the temperature of the display 1 to be maintained within a certain range. The cooling device 2 may be provided to efficiently disperse or dissipate high temperature heat of the display 1.

The cooling device 2 may include a fan 3. The cooling device 2 may include a case 2a and the fan 3 provided inside the case 2a. The case 2a of the cooling device 2 may include an inlet 4b for suctioning outside air and an outlet 4a for discharging the suctioned outside air through the fan 3. The cooling device 2 includes a flux augmentation guide 100 that is provided to increase the flux of air discharged to the display 1 through the fan 3.

The flux augmentation guide 100 of the cooling device 2 may have the outlet 4a that is shaped to cause entrainment of air according to the external environment. Entrainment caused by the flux augmentation guide 100 of the cooling device 2 is a phenomenon in which outside air is introduced by a high-speed core flow. That is, a cooling flow caused by the high speed core flow includes air introduced by the high-speed core flow.

A cooling flow Q3 increased by the entrainment of the cooling device 2 cools an outer wall of the display 1, and air is introduced to a high position of the large-area display 1, so that the cooling area is increased.

The flux augmentation guide 100 of the cooling device 2 may form a first fluid passage Q1 forming a first fluid flow at the rear surface 1a of the display 1 and a second fluid passage Q2 forming a second fluid flow introduced from a periphery of the first fluid passage Q1.

The flux augmentation guide 100 may be provided at the outlet 4a of the case 2a of the cooling device 2. The flux augmentation guide 100 may include a nozzle 101. The flux augmentation guide 100 may be formed to have a predetermined angle θ. The flux augmentation guide 100 may be obliquely arranged at a predetermined angle θ with respect to the outlet 4a.

The flux augmentation guide 100 according to the embodiment of the disclosure is illustrated as a nozzle that protrudes outward at the outlet, but the disclosure is not limited thereto. For example, the flux augmentation guide may include at least one of: a plurality of vanes or at least one duct. In addition, the flux augmentation guide may have various shapes at the outlet to increase the flux of the air discharged through the fan.

In addition, the flux augmentation guide 100 may have various shapes and structures for increasing the flux of the cooling flow Q3 by forming a pressure difference between the first fluid passage Q1 and the periphery of the first fluid passage Q1.

A primary cool flow generated through the flux augmentation guide 100 allows surrounding air (cool air) to be introduced into the primary flow without any additional device, thereby enhancing the cooling and increasing the cooling area.

Accordingly, the number and size of the fans 3 for increasing the flux of the cooling flow Q3 toward the rear surface of the display 1 may be remarkably reduced, and noise caused by the fan 3 may be reduced.

Figure 5:
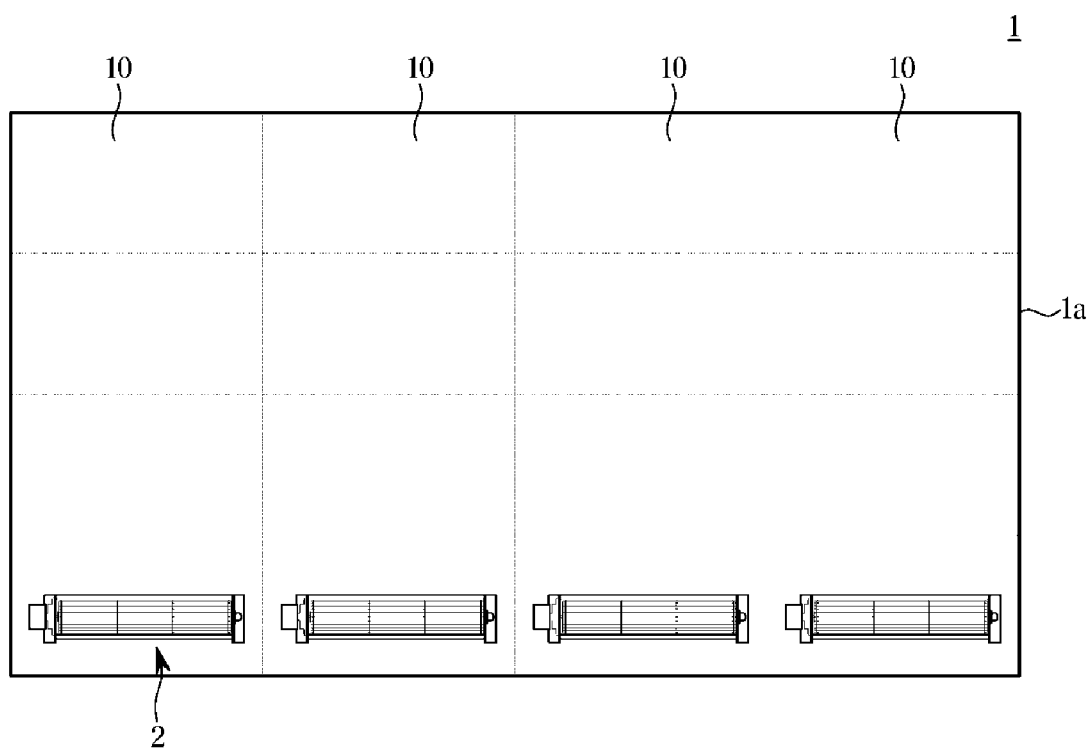
FIG. 5 is a view schematically illustrating a display apparatus equipped with a cooling device according to another embodiment of the disclosure.

FIG. 5 is a view schematically illustrating a display apparatus equipped with a cooling device according to another embodiment of the disclosure. Reference numerals not marked may be identified by referring to FIGS. 1 to 4.

Referring to FIG. 5, a cooling device 2 includes a fan 3 provided inside a case 2a (shown in FIG. 2).

The fan 3 is provided to discharge air introduced through an inlet 4b of the case 2a through an outlet 4a.

The fan 3 provided inside the case 2a may include a screen fan. The fan 3 may include a centrifugal fan. Air discharged through the fan 3 may be subject to entrainment by a flow entrainment guide 100 to thereby form a subsidiary flow.

The fan 3 of the cooling device 2 may be provided in various types of fans depending on the length of a distance D between the display 1 and the wall W. The distance D between the display 1 and the wall W may vary according to the size of the display 1 and the installation space.

In the drawing, a total of sixteen units of the display panels 10 are illustrated in the form of a matrix such as a 4×4 matrix while being coupled to a chassis 20 and a total of four units of the cooling device 2 are arranged at lower sides of the display panels 10, but the number and arrangement of the display panels 10 and the cooling devices 2 may be variously set without limitation.

Figure 6:
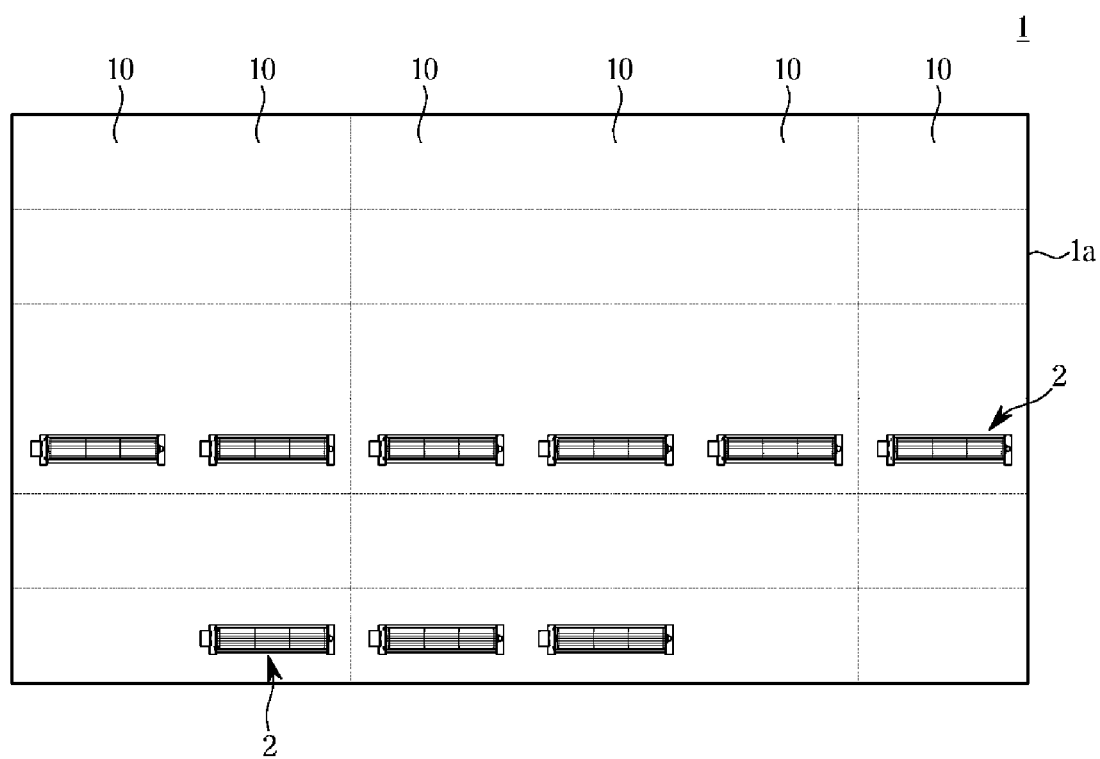
FIG. 6 is a view illustrating a display apparatus equipped with a cooling device according to another embodiment of the disclosure.

FIG. 6 is a view illustrating a display apparatus equipped with a cooling device according to another embodiment of the disclosure. Reference numerals not marked may be identified by referring to FIGS. 1 to 4.

In the drawing, a total of thirty six units of the display panels 10 are illustrated in the form of a matrix such as a 6×6 matrix while being coupled to a chassis 20 and a total of nine units of the cooling device 2 are arranged at lower sides of the display panels 10, but the number and arrangement of the display panels 10 and the cooling devices 2 may be variously set without limitation.

In this case, six of the nine cooling devices 2 may be arranged in the middle portion of the display 1 and the remaining three cooling devices 2 may be arranged in the lower center portion of the display 1. The arrangement of the cooling device 2 may be adjusted to minimize generation of heat by radiation or contact in consideration of the position of a viewer or occupant located in front of the display 1.

The cooling device 2 provided with the flux augmentation guide 100 of the disclosure is configured to form a first fluid passage Q1 forming a first fluid flow at a rear surface 1a of the display 1 and a second fluid passage Q2 forming a second fluid flow introduced from a periphery of the first fluid passage Q, rather than having a general form in which a plurality of fans are arranged at the rear of a display. Accordingly, the primary cooling flow allows surrounding air (cool air) to be introduced into the primary flow without any additional device, thereby enhancing the cooling and increasing the cooling area.

In addition, the flux augmentation guide 100 makes a primary contact with a required area of the display 1 so that the temperature of a particular part may be lowered to a target level, thereby maximizing the cooling effect.

Figure 7:
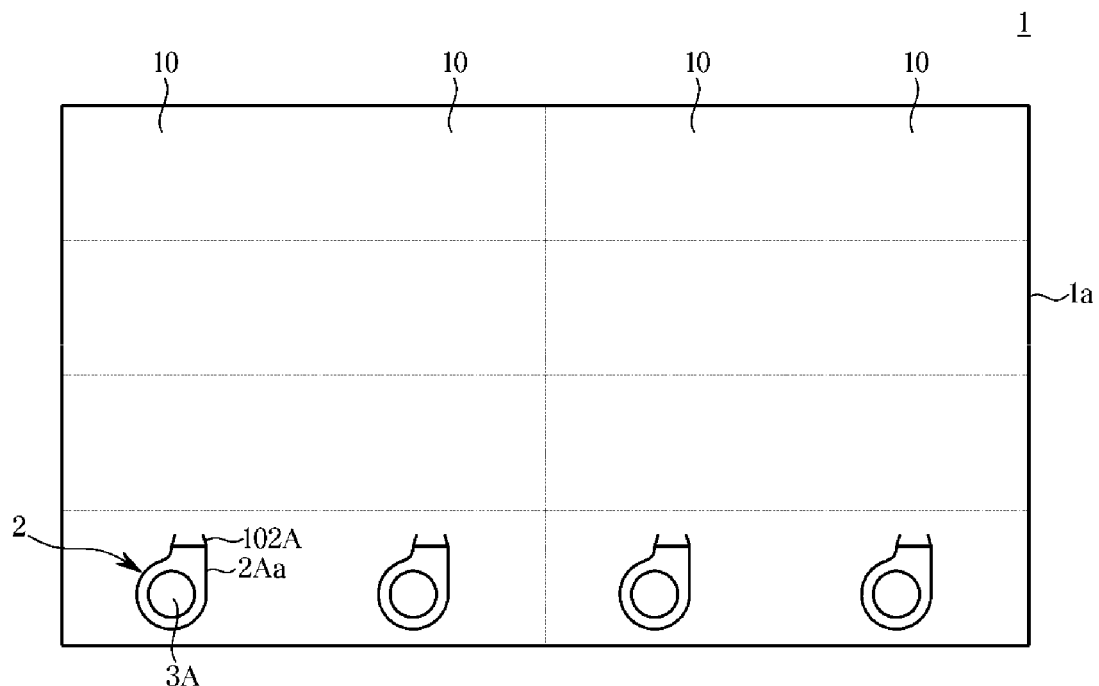
FIG. 7 is a view schematically illustrating a display apparatus equipped with a cooling device according to another embodiment of the disclosure.

FIG. 7 is a view schematically illustrating a display apparatus equipped with a cooling device according to another embodiment of the disclosure.

FIG. 7 is a view schematically illustrating a display apparatus equipped with a cooling device according to another embodiment of the disclosure. Referring to FIG. 7, a fan 3A of a cooling device 1 is provided inside a case 2Aa. Air discharged through the fan 3A may have a flux Q3 that is increased by the flux augmentation guide 100. The flux augmentation guide 100 may include a duct 102A formed at an outlet 4Aa of the case 2Aa of the cooling device 1. The duct 102A formed at the outlet 4Aa may be provided to form a first fluid passage Q1 forming a first fluid flow at a rear surface 1a of the display 1 and a second fluid passage Q2 forming a second fluid flow introduced from a periphery of the first fluid passage Q1.

The fan 3A provided inside the case 2Aa may include a circulator. The fan 3A of the cooling device 2 may be provided in various types of fans depending on the length of a distance D between the display 1 and the wall W. The distance D between the display 1 and the wall W may vary according to the size of the display 1 and the installation space.

In the drawing, a total of sixteen units of the display panels 10 are illustrated in the form of a matrix such as a 4×4 matrix while being coupled to a chassis 20 and a total of four units of the cooling devices 2 are arranged at lower sides of the display panels 10, but the disclosure is not limited thereto.

Figure 8:
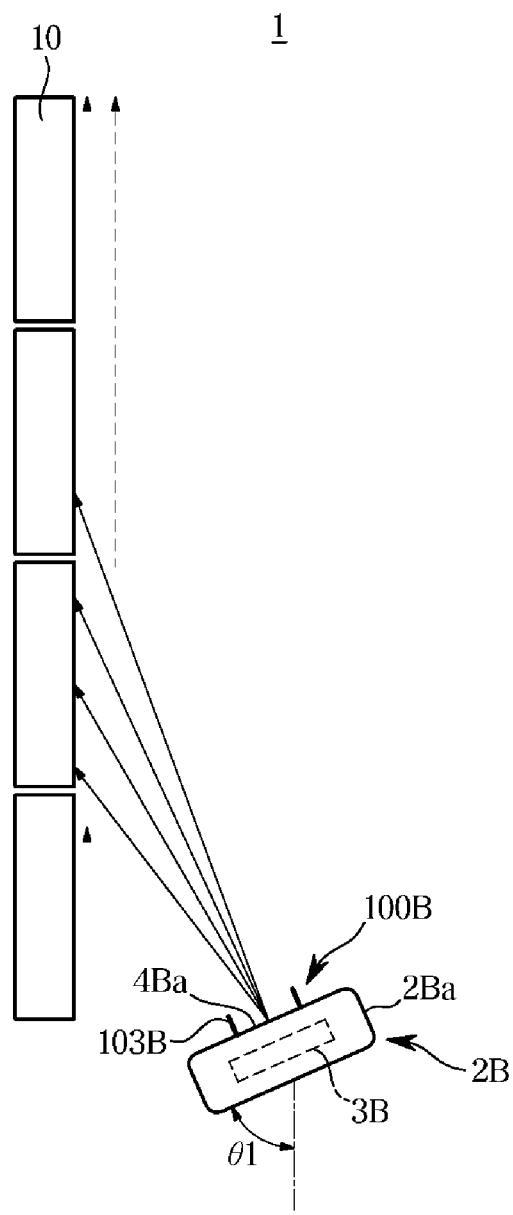
FIG. 8 is a view schematically illustrating an air flow by a cooling device according to another embodiment of the disclosure.

FIG. 8 is a view schematically illustrating an air flow by a cooling device according to another embodiment of the disclosure. Reference numerals not marked may be identified by referring to FIGS. 1 to 4.

Referring to FIG. 8, a fan 3B of a cooling device 2B is provided inside a case 2Ba. Air discharged through the fan 3B may have a cooling flux Q3 that is increased by a flux augmentation guide 100B. The flux augmentation guide 100B may include a vane 103B formed at an outlet 4Ba of the case 2Ba of the cooling device 2B. The vane 103B formed at the outlet 4Ba is provided to form a first fluid passage Q1 forming a first fluid flow at a rear surface 1a of a display 1 and a second fluid passage Q2 forming a second fluid flow introduced from a periphery of the first fluid passage Q1.

The cooling device 2B may be obliquely installed due to a distance D between the display 1 and the wall W. The cooling device 2B may be obliquely installed at an inclination of a first angle θ1. In the embodiment of the disclosure, the first angle θ1 is illustrated as being in a range of 0 to 70 degrees, but the disclosure is not limited thereto.

The cooling device 2B installed at the first angle θ1 may directly discharge air to a specific position of the rear surface 1a of the display 1 so that directly cooling is achieved, and the primary cooling flow allows surrounding air (cold air) to be introduced into the primary flow without any additional device, enhancing the cooling and increasing the cooling area.

Figure 9:
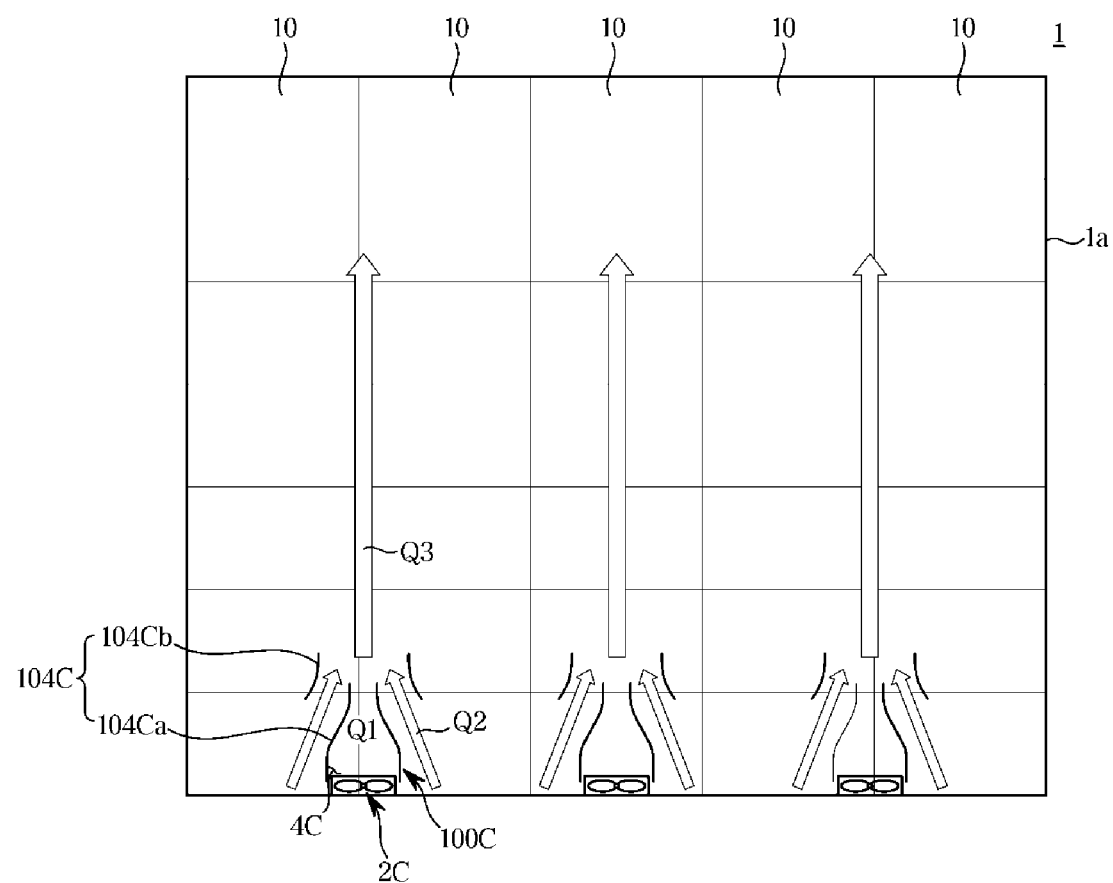
FIG. 9 is a view illustrating an air flow by a cooling device according to another embodiment of the disclosure.

FIG. 9 is a view illustrating an air flow by a cooling device according to another embodiment of the disclosure. Reference numerals not marked may be identified by referring to FIGS. 1 to 4.

Referring to FIG. 9, a flux augmentation guide 100C of a cooling device 2C may include a plurality of nozzles 104C formed at an outlet 4C of a case 2Ca of the cooling device 2C. The plurality of nozzles 104C formed at the outlet 4C is provided to form a first fluid passage Q1 forming a first fluid flow at a rear surface 1a of a display 1 and a second fluid passage Q2 forming a second fluid passage Q2 introduced from a periphery of the first fluid passage Q1. The plurality of nozzles 104C may include a first nozzle 104Ca and a second nozzle 104Cb disposed above the first nozzle 104Ca.

The plurality of nozzles 104C may be formed in a two-dimensional shape, unlike the three-dimensional flux augmentation guide 100 when a distance D between the display 1 and the wall W is narrow.

The plurality of nozzles 104C may include the first nozzle 104Ca that is arranged on the upper side of the case 2Ca and provided in a three-dimensional (3D) curved shape for converting a flow having velocity components of various scales, which is generated by a fan 3 (a centrifugal fan or an axial flow fan), into a flow having a uniformity and a high velocity at a central portion thereof. The first nozzle 104Ca may have a first curvature R1.

The plurality of nozzles 104C may further include the second nozzle 104Cb arranged on the upper side of the first nozzle 104Ca and provided in a shape that allows a secondary flow generated by a primary flow to be introduced in the same direction and augmented. The second nozzle 104Cb may have a second curvature R2.

As such, the flux augmentation guide 100C implemented as the plurality of nozzles 104C generates a primary cooing flow that allows surrounding air (cool air) to be introduced into the primary flow without any additional device, thereby enhancing the cooling and increasing the cooling area.

As is apparent from above, the display apparatus can reduce the temperature of a large-area display through fan cooling while enhancing the cooling efficiency.

The display apparatus can reduce unpleasant feeling of a user by cooling the display apparatus by convection or conduction.

The display apparatus can minimize the number of fans used for cooling and noise.

The scope of the disclosure is not limited to the aforementioned embodiments. It will be understood by those skilled in the art that various changes in form and details may be made therein without departing from the spirit and scope of the disclosure as defined by the appended claims and their equivalents.

What is claimed is:

1. A display apparatus, comprising:
    a display on which an image is to be displayed; and
    a cooling device configured to discharge air from a fan at a rear side of the display, the cooling device including:
        a case having an inlet and an outlet, the fan being provided in the case, and
        a flux augmentation guide including a first fluid passage forming a first fluid flow at the rear side of the display and a second fluid passage forming a second fluid flow introduced from a periphery of the first fluid passage at the rear side of the display, and
    wherein the flux augmentation guide is configured to increase a flux of air discharged toward the display by the fan,
    wherein the air discharged through the flux augmentation guide is directed parallel or at an angle with respect to a rear surface of the display,
    wherein the flux augmentation guide is provided at the outlet of the case.

2. The display apparatus of claim 1, wherein the flux augmentation guide includes a plurality of vanes.

3. The display apparatus of claim 1, wherein the flux augmentation guide includes at least one duct.

4. The display apparatus of claim 1, wherein the flux augmentation guide includes a nozzle.

5. The display apparatus of claim 1, wherein the rear side of the display is disposed to be spaced apart from a wall on which the display is mountable, and
    wherein the cooling device is disposed between the display and the wall.

6. The display apparatus of claim 1, wherein the fan is obliquely disposed with respect to the rear surface of the display.

7. The display apparatus of claim 1, wherein the fan includes at least one of a screen fan or a circulator.

8. The display apparatus of claim 1, wherein the air discharged toward the display is directed parallel or at an angle with respect to a rear surface of the display.

9. A display apparatus, comprising:
    a display including a plurality of display panels on which an image is to be displayed; and
    a cooling device configured to discharge air from a fan at a rear side of the display, wherein the cooling device includes:
        a case having an inlet and an outlet, the fan being provided in the case, and
        a flux augmentation guide including a first fluid passage forming a first fluid flow and a second fluid passage forming a second fluid flow introduced from a periphery of the first fluid path to increase a flux of air discharged toward the display by the fan, wherein the air discharged through the flux augmentation guide is directed parallel or at an angle with respect to a rear surface of the display, wherein the flux augmentation guide is provided at the outlet of the case.

10. The display apparatus of claim 9, wherein the flux augmentation guide includes a plurality of vanes.

11. The display apparatus of claim 9, wherein the flux augmentation guide includes a duct.

12. The display apparatus of claim 9, wherein the flux augmentation guide includes a nozzle.

13. The display apparatus of claim 9, wherein a rear surface of the display is disposed to be spaced apart from a wall on which the display is mountable, and wherein the cooling device is disposed between the display and the wall.

14. The display apparatus of claim 9, wherein the cooling device is obliquely disposed with respect to a rear surface of the display.

\* \* \* \* \*